(12) United States Patent
Jeon et al.

(10) Patent No.: US 10,083,069 B2
(45) Date of Patent: *Sep. 25, 2018

(54) WORD LINE DEFECT DETECTION AND HANDLING FOR A DATA STORAGE DEVICE

(71) Applicant: SANDISK TECHNOLOGIES LLC, Plano, TX (US)

(72) Inventors: Seungjune Jeon, Milpitas, CA (US); Idan Alrod, Herzliya (IL); Eran Sharon, Rishon Lezion (IL); Dana Lee, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 928 days.

This patent is subject to a terminal disclaimer.

(21) Appl. No.: 13/928,774

(22) Filed: Jun. 27, 2013

(65) Prior Publication Data
US 2015/0006975 A1 Jan. 1, 2015

(51) Int. Cl.
G11C 29/00 (2006.01)
G06F 11/07 (2006.01)
G11C 29/02 (2006.01)
G11C 16/34 (2006.01)

(52) U.S. Cl.
CPC ........ G06F 11/0751 (2013.01); G11C 29/021 (2013.01); G11C 29/025 (2013.01); G11C 29/028 (2013.01); G11C 16/3404 (2013.01)

(58) Field of Classification Search
CPC ......... G11C 29/50; G11C 16/04; G11C 29/02; G11C 29/028; H05K 999/99
USPC ....................................................... 714/721
See application file for complete search history.

(56) References Cited

U.S. PATENT DOCUMENTS

| | | | |
|---|---|---|---|
| 5,657,332 A * | 8/1997 | Auclair | G11C 16/10 365/184 |
| 6,111,799 A | 8/2000 | Uchida | |
| 7,237,154 B1 * | 6/2007 | Zorian | G11C 29/56008 714/711 |
| 7,623,388 B2 | 11/2009 | Chen et al. | |

(Continued)

FOREIGN PATENT DOCUMENTS

WO   WO 2008068747 A2 *  6/2008 .......... G06F 11/1068

OTHER PUBLICATIONS

International Search Report and Written Opinion of the International Searching Authority (EPO) for International Application No. PCT/US2014/043323, dated Dec. 16, 2014, 17 pages.

(Continued)

*Primary Examiner* — Albert Decady
*Assistant Examiner* — Enam Ahmed
(74) *Attorney, Agent, or Firm* — Michael Best & Friedrich LLP

(57) ABSTRACT

A data storage device includes a non-volatile memory and a controller. The non-volatile memory includes a word line coupled to a plurality of storage elements. A method includes detecting a condition associated with a defect in the word line. A first subset of the plurality of storage elements and a second subset of the plurality of storage elements are determined based on an estimated location of the defect. The method further includes determining a first read threshold for the first subset and a second read threshold for the second subset.

21 Claims, 5 Drawing Sheets

(56) References Cited

U.S. PATENT DOCUMENTS

| | | | |
|---|---|---|---|
| 7,876,621 B2 | 1/2011 | Sharon et al. | |
| 7,954,018 B2* | 5/2011 | Ho | G11C 29/10 |
| | | | 365/201 |
| 8,000,135 B1 | 8/2011 | Perlmutter et al. | |
| 8,032,804 B2 | 10/2011 | Jeddeloh | |
| 8,351,286 B2* | 1/2013 | Huang | G11C 29/025 |
| | | | 365/185.09 |
| 9,431,118 B1* | 8/2016 | Bar | G11C 29/021 |
| 2003/0071262 A1* | 4/2003 | Weiner | G01N 21/66 |
| | | | 257/48 |
| 2003/0161182 A1 | 8/2003 | Li et al. | |
| 2004/0111553 A1* | 6/2004 | Conley | G06F 12/0246 |
| | | | 711/103 |
| 2005/0286336 A1* | 12/2005 | Harari | G06F 3/0601 |
| | | | 365/232 |
| 2006/0221660 A1 | 10/2006 | Hemink et al. | |
| 2007/0198786 A1* | 8/2007 | Bychkov et al. | 711/154 |
| 2008/0250300 A1 | 10/2008 | Mokhlesi et al. | |
| 2009/0251943 A1 | 10/2009 | Kurjanowicz | |
| 2009/0279772 A1* | 11/2009 | Sun et al. | 382/141 |
| 2009/0319868 A1 | 12/2009 | Sharon et al. | |
| 2012/0008405 A1* | 1/2012 | Shah et al. | 365/185.19 |
| 2012/0063227 A1* | 3/2012 | Weingarten | G11C 11/5628 |
| | | | 365/185.09 |
| 2012/0188824 A1* | 7/2012 | Chen | G11C 11/5628 |
| | | | 365/185.19 |
| 2012/0281479 A1 | 11/2012 | Kochar et al. | |
| 2013/0128665 A1* | 5/2013 | Mokhlesi | G11C 16/04 |
| | | | 365/185.09 |
| 2014/0085985 A1* | 3/2014 | Pan | G11C 5/145 |
| | | | 365/185.18 |
| 2014/0157068 A1* | 6/2014 | Wu | G11C 11/5642 |
| | | | 714/721 |
| 2014/0233317 A1 | 8/2014 | Bellorado et al. | |
| 2014/0254264 A1* | 9/2014 | Dutta | G11C 16/3459 |
| | | | 365/185.03 |
| 2014/0281766 A1 | 9/2014 | Yang et al. | |
| 2014/0300890 A1 | 10/2014 | Lange et al. | |
| 2015/0193299 A1* | 7/2015 | Hyun | G11C 29/52 |
| | | | 714/6.24 |
| 2016/0146971 A1* | 5/2016 | Gerling | G01V 99/00 |
| | | | 702/5 |

OTHER PUBLICATIONS

Invitation to Pay Additional Fees and Partial International Search for International Application No. PCT/US2014/043323, dated Oct. 14, 2014, 7 pages.

Non-Final Office Action dated Jan. 16, 2015 in U.S. Appl. No. 14/285,338, 8 pages.

International Preliminary Report on Patentability for International Application No. PCT/US2014/043323, dated Jan. 7, 2016, 13 pages.

Notice of Allowance and Fee(s) Due dated Jul. 31, 2015 in U.S. Appl. No. 14/285,338, 8 pages.

Notice of Allowance and Fee(s) Due dated May 7, 2015 in U.S. Appl. No. 14/285,338, 8 pages.

First Office Action dated Jun. 21, 2017 in Chinese Application No. 201480019289.X, 21 pages.

Communication pursuant to Article 94(3) EPC dated Mar. 12, 2018 in European Application No. 14738995.1, 6 pages.

* cited by examiner

WORD LINE DEFECT DETECTION AND HANDLING FOR A DATA STORAGE DEVICE

FIELD OF THE DISCLOSURE

The present disclosure is generally related to detecting and handling word line defects in data storage devices.

BACKGROUND

Non-volatile data storage devices, such as embedded memory devices and removable memory devices, have enabled increased portability of data and software applications. For example, flash memory devices can enhance data storage density by storing multiple bits in each flash memory cell. Data storage density may also be increased by reducing device feature dimensions. However, as device feature dimensions scale down, process variations in the non-volatile data storage devices may impair device performance. Further, as the non-volatile data storage devices store more data (e.g., by increasing the number of bits stored at a memory cell), users increasingly depend on reliable operation of such non-volatile data storage devices (e.g., to reliably access data stored at the devices). Accordingly, a need exists to handle process variations and other defects that can degrade operation of non-volatile storage devices.

SUMMARY

A non-volatile memory may include a word line that is accessible by a controller to access storage elements of the non-volatile memory. For example, the word line may be used by the controller to program voltages at storage elements of the non-volatile memory. If the word line includes a defect, such as a manufacturing defect, performance of the non-volatile memory may be degraded. For example, a process variation of a width of the word line may change an electrical property of the word line, altering performance of the non-volatile memory. Accordingly, accessing data stored at the non-volatile memory may result in errors because the defect may distort data accessed from the storage elements (e.g., by causing an intended logical "0" value to appear as a logical "1" value, etc.).

In accordance with at least one embodiment of the present disclosure, the controller determines whether the word line has a defect. If the word line has a defect, the controller determines an estimated location of the defect. The controller may determine voltage thresholds for reading data stored at the storage elements based on the estimated location of the defect. For example, the controller may determine a first set of read thresholds for storage elements that are on a first side (e.g., to the left) of the defect and may determine a second set of read thresholds for storage elements that are on a second side (e.g., to the right) of the defect. By using voltage thresholds that are determined based on the estimated location of the defect, bit error rates of read data may be reduced as compared to applying a common set of read thresholds for all of the storage elements accessed via the word line including the defect.

DETAILED DESCRIPTION

Figure 1:
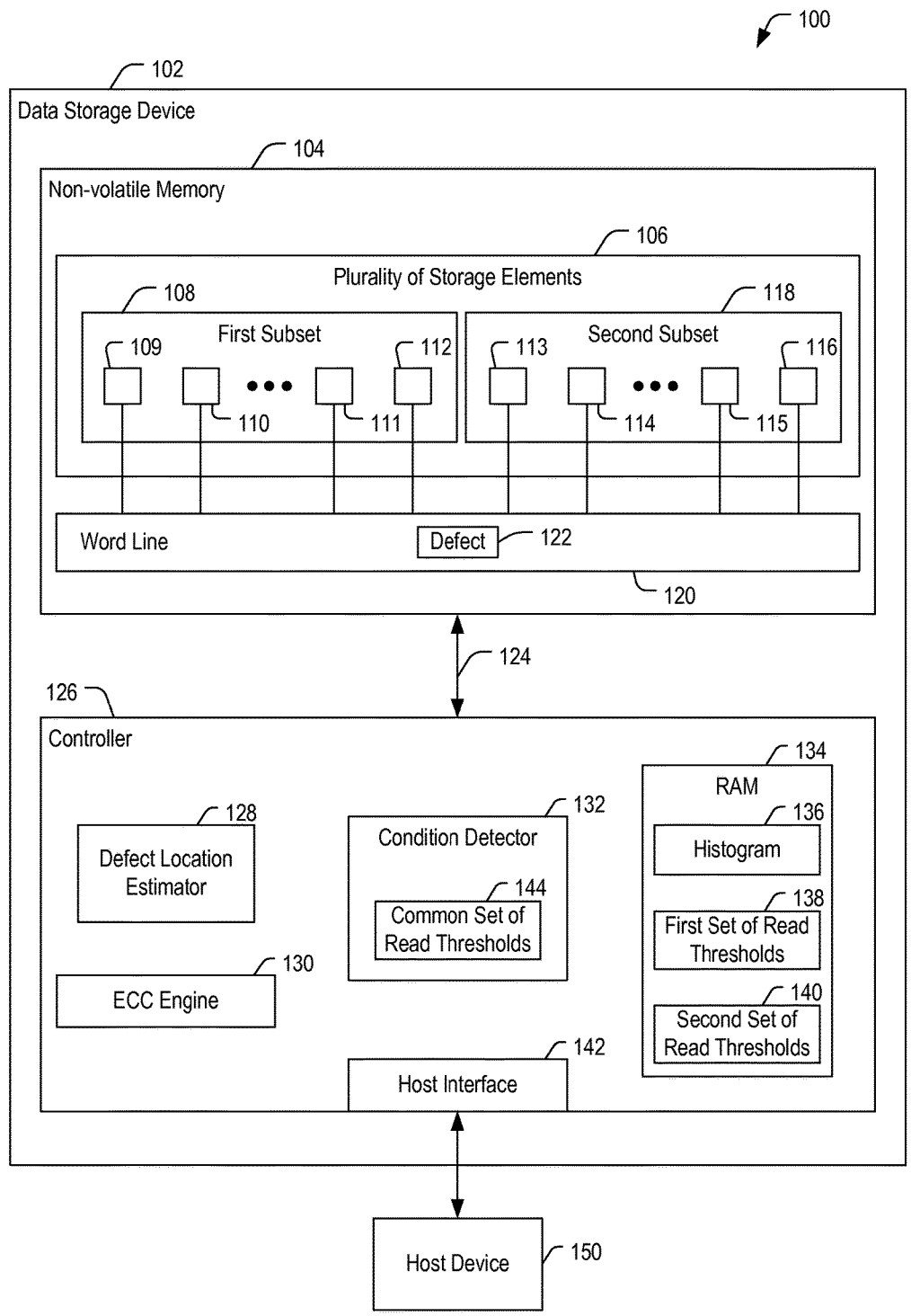
FIG. 1 is a block diagram of a particular illustrative embodiment of a system including a data storage device configured to determine an estimated location of a defect of a word line.

Referring to FIG. 1, a particular embodiment of a system 100 includes a data storage device 102 and a host device 150. In the particular example of FIG. 1, the data storage device 102 is coupled to the host device 150. For example, the data storage device 102 may be removably coupled to the host device 150, such as in connection with a removable universal serial bus (USB) configuration. In at least one alternate embodiment, the data storage device 102 is embedded within the host device 150, such as in accordance with an embedded MultiMedia Card (eMMC) configuration.

To further illustrate, the data storage device 102 may correspond to a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 150 as embedded memory, such as in connection with eMMC® (trademark of JEDEC Solid State Technology Association, Arlington, Va.) and eSD configurations, as illustrative examples. To illustrate, the data storage device 102 may correspond to an eMMC device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a non-volatile memory 104 and a controller 126. The non-volatile memory 104 and the controller 126 may be coupled via a bus, interface, or other structure, such as an interface 124. In a particular illustrative embodiment, the non-volatile memory 104 may include a flash memory (e.g., a NAND flash memory or a NOR flash memory). In other implementations, the non-volatile memory 104 may include an erasable programmable read-only memory (EPROM), an electrically-erasable programmable read-only memory (EEPROM), a read-only memory (ROM), a one-time programmable memory (OTP), another type of memory, or a combination thereof.

The non-volatile memory 104 includes a plurality of storage elements 106, such as a plurality of flash multi-level cells (MLCs), coupled to a word line 120. The plurality of storage elements 106 includes a first subset 108 that includes storage elements 109, 110, 111, 112. The plurality of storage elements 106 further includes a second subset 118 that includes storage elements 113, 114, 115, 116. Each of the storage elements 109-116 may be configured to store a respective voltage indicating one of a plurality of logical bit values. It should be appreciated that the example of FIG. 1 is illustrative and that the non-volatile memory 104 may include a different number of and/or configuration of storage elements than shown in the particular example of FIG. 1.

The non-volatile memory 104 may include a structure (e.g., a component) having a defect. To illustrate, the word line 120 may include a defect 122. The defect 122 may correspond to a process variation of the word line 120. For example, the defect 122 may correspond to a process variation that causes a width of a portion of the word line 120 to be less than a threshold width (e.g., a design specification), altering an electrical property of the word line 120. As another example, the defect 122 may correspond to a physical break in the word line 120.

The controller 126 may include a defect location estimator 128, an error correction code (ECC) engine 130, a condition detector 132, and a random access memory (RAM) 134. The RAM 134 may store operating parameters and data, such as one or more management tables (e.g., a file allocation table). The controller 126 may further include a host interface 142 configured to operatively couple the data storage device 102 to the host device 150. For example, if the data storage device 102 is configured to be removed from the host device 150, the host interface 142 may correspond to a universal serial bus (USB) interface. As another example, if the data storage device 102 is embedded within the host device 150, the host interface 142 may correspond to an embedded MultiMedia Card (eMMC) interface.

The controller 126 is configured to receive data and instructions from the host device 150 and to send data to the host device 150. The controller 126 is further configured to send data and commands to the non-volatile memory 104 and to receive data from the non-volatile memory 104. For example, the controller 126 is configured to send data and a write command to cause the non-volatile memory 104 to store the data to a specified address of the non-volatile memory 104. As another example, the controller 126 is configured to send a read command to read data from a specified address of the non-volatile memory 104.

The ECC engine 130 may be configured to receive data from the host device 150 to be stored to the non-volatile memory 104 and to generate a codeword based on the data. For example, the ECC engine 130 may include an encoder configured to encode data using an ECC encoding technique. The ECC engine 130 may include a Reed Solomon encoder, a Bose-Chaudhuri-Hocquenghem (BCH) encoder, a low-density parity check (LDPC) encoder, a turbo encoder, an encoder configured to encode data according to one or more other ECC encoding techniques, or a combination thereof. The ECC engine 130 may include a decoder configured to decode data read from the non-volatile memory 104 to detect and correct, up to an error correction capability of an ECC technique, bit errors that may be present in the data. Depending on the location and nature of the defect 122, data read from certain storage elements of the plurality of storage elements 106 may contain a relatively large amount of errors that may be uncorrectable unless the defect 122 is handled prior to decoding the data by the ECC engine 130 (e.g., by determining unique read thresholds for the certain storage elements), as explained further below.

The host device 150 may correspond to a mobile telephone, a music player, a video player, a gaming console, an electronic book reader, a personal digital assistant (PDA), a computer, such as a laptop computer, notebook computer, or tablet, another electronic device, or a combination thereof.

The host device 150 communicates via the host interface 142, which may enable the host device 150 to read data from the non-volatile memory 104 and to write data to the non-volatile memory 104. For example, the host device 150 may operate in compliance with a Joint Electron Devices Engineering Council (JEDEC) industry specification, such as a Universal Flash Storage (UFS) Host Controller Interface specification or an embedded MultiMedia Card (eMMC) specification. As other examples, the host device 150 may operate in compliance with one or more other specifications, such as a Secure Digital (SD) Host Controller specification as an illustrative example. The host device 150 may communicate with the non-volatile memory 104 in accordance with another suitable communication protocol.

During operation, the controller 126 may detect a condition associated with a defect of the non-volatile memory 104, such as a condition associated with the defect 122 of the word line 120. As a particular example, the controller 126 may store data to each of the plurality of storage elements 106 and may read the data (e.g., using a "high resolution" read technique) to generate an estimated distribution of voltages, such as a histogram 136. The histogram 136 may indicate a distribution of sensed voltages at the plurality of storage elements 106, which may deviate from the voltages that were "intended" to be programmed at the plurality of storage elements 106 due to the defect 122. The histogram 136 may be stored at the RAM 134, as depicted in the example of FIG. 1. The histogram 136 may be generated during operation of the data storage device 102 (e.g., "dynamically" during user operation), while operation of the data storage device 102 is tested or verified (e.g., in connection with a device under test (DUT) process), or a combination thereof.

The condition detector 132 may analyze the histogram 136 (or similar data) to determine whether a defect exists in the word line 120. The condition detector 132 may detect a condition associated with the defect 122 if the read data contains a number of errors (e.g., as determined by the ECC engine 130) that exceeds a threshold.

To further illustrate, the defect 122 may cause voltages sensed from the storage elements 113-116 to be different (e.g., by a threshold amount) than voltages sensed from the storage elements 109-112, even if the controller 126 attempted to program similar voltages to each of the storage elements 109-116. Accordingly, the condition detector 132 may detect a condition associated with the defect 122 of the word line 120 based on the histogram 136. The condition may correspond to the deviation in the histogram 136, such as when the histogram 136 indicates two different distributions of voltages stored at the plurality of storage elements 106 due to the defect 122 (e.g., when a common set of read thresholds 144 is applied to the subsets 108, 118). The condition detector 132 may detect the condition by determining that the histogram 136 indicates that a voltage difference between adjacent storage elements (e.g., the storage elements 112, 113) of the plurality of storage elements 106 exceeds a threshold. The condition detector 132 may analyze the histogram 136 to determine whether a portion of the distribution of voltages deviates from the remainder of the distribution of voltages by a threshold amount, such as when a first mean voltage of a first portion of the distribution of voltages is greater than or less than a second mean voltage of a second portion of the distribution of voltages by at least a threshold amount.

In response to the condition detector 132 detecting the condition associated with the defect 122, the defect location estimator 128 may determine an estimated location of the defect 122. According to various illustrative examples, to determine the estimated location of the defect 122, the defect location estimator 128 may utilize a Gaussian mixture model (GMM) technique, a binary search technique, another technique, or a combination thereof. Examples of a GMM technique and a binary search technique are described further with reference to FIGS. 3 and 4, respectively. In the particular example of FIG. 1, the defect location estimator 128 may estimate that the defect 122 is located between the storage elements 112, 113.

Based on the estimated location of the defect 122, the controller 126 may determine a first set of read thresholds 138 for storage elements to one side (e.g., to the left) of the defect 122, such as the first subset 108, and a second set of read thresholds 140 for storage elements to the other side (e.g., to the right) of the defect 122, such as the second subset 118. The sets of read thresholds 138, 140 may be stored at the non-volatile memory 104 and loaded into the RAM 134 during operation of the data storage device 102. The controller 126 may read data stored at the first subset 108 using the first set of read thresholds 138 and may read data at the second subset 118 using the second set of read thresholds 140.

By reading data at the second subset 118 using the second set of read thresholds 140, bit error rates associated with data stored at the second subset 118 may be reduced as compared to reading the data using the first set of read thresholds 140 or reading the data using the common set of read thresholds 144. For example, because the defect 122 in the word line 120 may affect the distribution of voltages at the second subset 118, a boundary between two states (e.g., an erase state and a state "A") may be at a first voltage for the storage elements 113-116 and may be at a different voltage for the storage elements 109-112. Therefore, by reading the second subset 118 using the second set of read thresholds 140, a bit error rate may be reduced. For example, the second set of read thresholds 140 may be determined based on the "actual" distribution of voltages at the second subset 118 (due to the defect 122) instead of an expected distribution of voltages at the second subset 118 when the defect 122 is assumed not to exist or is not considered, as in certain conventional devices.

As a result, reliability of data stored at the non-volatile memory 104 may be improved due to fewer bit errors resulting from the defect 122 or similar defects. Improved reliability may enable operation using a less-powerful ECC engine, resulting in reduced power consumption, reduced device size, reduced manufacturing cost, or a combination thereof. Alternatively or in addition, improved reliability may enable longer operational life of the non-volatile memory 104.

Figure 2:
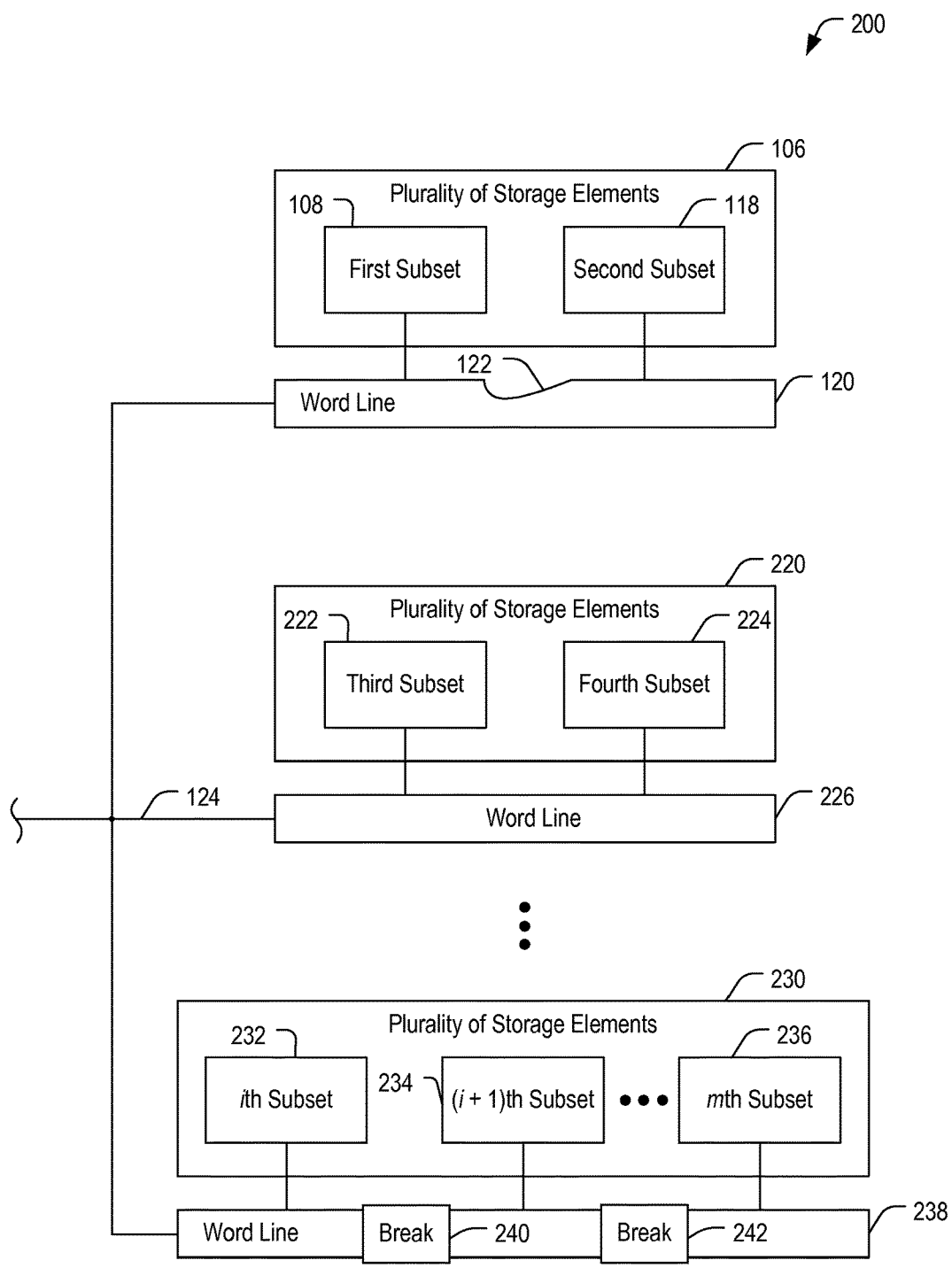
FIG. 2 is a block diagram illustrating a particular embodiment of components that may be incorporated in the data storage device of FIG. 1.

Referring to FIG. 2, a particular embodiment of at least a portion 200 of the non-volatile memory 104 of FIG. 1 is depicted. The portion 200 includes the plurality of storage elements 106, the word line 120, and the interface 124. The plurality of storage elements 106 includes the first subset 108 and the second subset 118. The word line 120 includes the defect 122.

In the example of FIG. 2, the defect 122 corresponds to a process variation in a width of the word line 120. For example, the width of the word line 120 may vary from a design specification associated with the non-volatile memory 104, causing voltages stored at the second subset 118 to deviate with respect to voltages stored at the first subset 108.

The portion 200 of FIG. 2 further includes a second plurality of storage elements 220 coupled to a second word line 226 and an nth plurality of storage elements 230 coupled to an nth word line 238, where n is an integer. The word lines 226, 238 are coupled to the interface 124. The second plurality of storage elements 220 may include a third subset 222 of storage elements and a fourth subset 224 of storage elements. The nth plurality of storage elements 230 may include an ith subset 232 of storage elements, an (i+1)th subset 234 of storage elements, and an mth subset 236 of storage elements, where i and m are integers. It should be appreciated that sizes of the subsets 108, 118, 222, 224, 232, 234, 236 may be different (e.g., each of the subsets 108, 118, 222, 224, 232, 234, 236 may include any number of storage elements).

In operation, the condition detector 132 of FIG. 1 may detect a condition associated with the defect 122, as described with reference to FIG. 1. The defect location estimator 128 may determine an estimated location of the defect 122, as described with reference to FIG. 1. The first set of read thresholds 138 may be determined for the first subset 108 and the second set of read thresholds 140 may be determined for the second subset 118, as described with reference to FIG. 1.

The portion 200 may include at least one word line that does not include a defect, such as the second word line 226 in the example of FIG. 2. The condition detector 132 may be further configured to determine that the second word line 226 does not include a defect. For example, by determining that a distribution of voltages read from the third subset 222 is substantially similar (e.g., within a difference threshold) to a distribution of voltages read from the fourth subset 224, the condition detector 132 may determine that no condition exists indicating a defect in the second word line 226. In response to determining that no such condition is detected, the controller 126 may apply one set of read thresholds (e.g., the common set of read thresholds 144 of FIG. 1) to read data from the subsets 222, 224.

The portion 200 may include at least one word line with multiple defects, such as the nth word line 238 in the example of FIG. 2. The condition detector 132 may be further configured to detect conditions associated with multiple defects, such as a second defect 240 and a third defect 242, in the nth word line 238. The condition detector 132 may detect the conditions associated with the defects 240, 242 using one or more techniques described herein, such as one or more techniques described with reference to FIG. 1. The controller 126 may determine estimated locations of the defects 240, 242 and may further determine corresponding sets of read thresholds for the subsets 232, 234, 236, such as using one or more techniques described with reference to FIG. 1. The sets of read thresholds may be stored at the RAM 134 of FIG. 1.

In the example of FIG. 2, the defects 240, 242 correspond to "break points" in the nth word line 238, such as physical breaks in the nth word line 238. For example, in certain configurations, a word line may conduct electrical signals despite having a physical break, such as when the word line is coupled to other structures that enable electrical conduction notwithstanding the physical break. Despite being electrically conductive, such a word line may exhibit altered or degraded electrical properties due to the physical break. Those of skill in the art will appreciate that the example of FIG. 2 is illustrative and that the particular configuration of the non-volatile memory 104 and/or the location and nature of any defects will depend on various factors, such as the particular application for which the non-volatile memory 104 is used, the process used to fabricate the non-volatile memory 104, one or more other factors, or a combination thereof.

Because the condition detector 132 is configured to detect conditions associated with defects in the word lines 120, 226, 238, performance (e.g., bit error rate) of the non-volatile memory 104 may be improved. For example, because the condition detector 132 is configured to determine the condition associated with the defect 122, separate sets of read thresholds may be determined for the subsets 108, 118. As another example, because the condition detector 132 is configured to determine that no condition associated with a defect in the second word line 226 exists, a common set of read thresholds may be used to read the plurality of storage elements 220 (i.e., the subsets 222, 224). As another example, because the condition detector 132 is configured to determine conditions associated with the defects 240, 242, separate sets of read thresholds may be determined for the subsets 232, 234, 236. Accordingly, read thresholds used to read data from the non-volatile memory 104 may more accurately reflect voltages stored at the non-volatile memory 104, resulting in lower bit error rates and improved performance.

Figure 3:
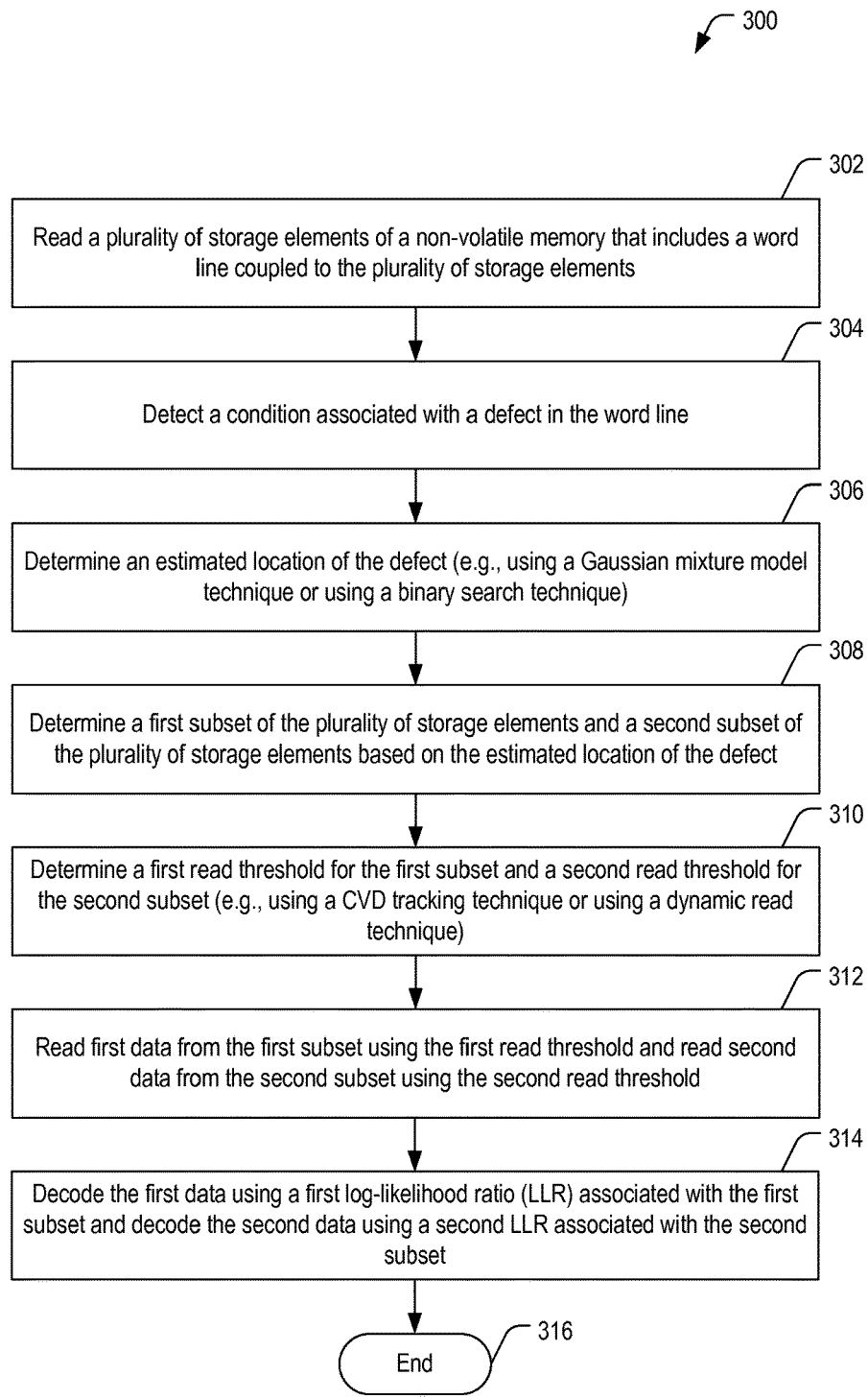
FIG. 3 is a flow chart of a particular illustrative embodiment of a method of detecting and handling a defect in a word line, such as the word line of the data storage device of FIG. 1.

Referring to FIG. 3, a particular illustrative embodiment of a method of detecting and handling a defect in a word line, such as the word line 120 of the data storage device 102 FIG. 1, is depicted and generally designated 300. The method 300 may be performed at a data storage device, such as in the data storage device 102 of FIG. 1. For example, the method 300 may be performed by the controller 126 of the data storage device 102 of FIG. 1.

The method 300 may include reading a plurality of storage elements of a non-volatile memory that includes a word line coupled to the plurality of storage elements, at 302. The non-volatile memory may correspond to the non-volatile memory 104 of FIG. 1. The plurality of storage elements may correspond to the plurality of storage elements 106 of FIGS. 1 and 2, the second plurality of storage elements 220 of FIG. 2, the nth plurality of storage elements 230 of FIG. 2, or a combination thereof. The word line may correspond to the word line 120 of FIGS. 1 and 2, the second word line 226 of FIG. 2, the nth word line 238 of FIG. 2, or a combination thereof.

The method 300 includes detecting a condition associated with a defect in the word line, at 304. The condition may be detected using one or more techniques described with reference to FIG. 1. For example, the condition may be detected by determining that a number of ECC errors associated with data read from the plurality of storage elements 106 exceeds a threshold number of ECC errors. As another example, the condition may be detected by determining that the histogram 136 indicates two sets of voltage distributions sensed from the plurality of storage elements 106. The defect may correspond to the defect 122 of FIGS. 1 and 2, the second defect 240 of FIG. 2, the third defect 242 of FIG. 2, or a combination thereof. The condition may be detected by the condition detector 132 of FIG. 1.

The method 300 may further include determining an estimated location of the defect, at 306. The estimated location of the defect may be determined by the defect location estimator 128 of FIG. 1. In at least one implementation, the estimated location of the defect is determined according to a Gaussian mixture model (GMM) technique. Alternatively or in addition, the estimated location of the defect may be determined according to a binary search technique. Particular examples of a GMM technique and a binary search technique are described further with reference to FIGS. 4 and 5, respectively.

At 308, a first subset of the plurality of storage elements and a second subset of the plurality of storage elements are determined based on the estimated location of the defect. The first subset and the second subset may correspond to the subsets 108, 118 of FIGS. 1 and 2, any of the subsets 232, 234, 236 of FIG. 2, or a combination thereof.

At 310, a first read threshold for the first subset is determined and a second read threshold for the second subset is determined. The first read threshold may be included in one of the sets of read thresholds 138, 140 of FIG. 1. The second read threshold may be included in the other of the sets of read thresholds 138, 140 of FIG. 1. The first read threshold and the second read threshold may be determined using a cell voltage distribution (CVD) tracking technique, a dynamic read technique, another technique, or a combination thereof.

In accordance with an example CVD tracking technique, voltages may be sensed from the storage elements 109-116 at different times (e.g., "tracked") to determine a difference between the voltages. For example, because factors such as programming noise, read noise, charge leakage, and/or physical alteration or degradation of the storage elements 109-116 may affect the voltages stored at the storage elements 109-116 over time (e.g., during operation of the data storage device 102), a difference between sensed voltages due to such factors may be used to determine the relative values of read thresholds. As a non-limiting example, one or more of the storage elements 109-116 may be programmed at a particular voltage (e.g., 2 volts). If the programmed voltage changes by a relatively small amount during operation of the data storage device 102 (e.g., by ±0.1 volts), then read thresholds may be selected that are relatively "close" to the programmed voltage (e.g., 1.9 volts and 2.1 volts). If the programmed voltage changes by a greater amount, then read thresholds may be selected that are "farther" from the programmed voltage (e.g., 1.8 volts and 2.2 volts).

In accordance with an example dynamic read technique, a data retention time associated with the storage elements 109-116 may be utilized to determine read thresholds for the storage elements 109-116. Because current may leak from the storage elements 109-116 after programming, the storage elements 109-116 may be associated with a finite data retention time (e.g., programmed voltages at the storage elements 109-116 may degrade as a function of retention time). Accordingly, read thresholds for the storage elements 109-116 may be adjusted based on a data retention time associated with the storage elements 109-116. As a non-limiting example, read thresholds for the storage element 109 may be adjusted based on a duration that the storage element 109 stores a particular value, an expected duration that the storage element 109 will reliably store a data value, or a combination thereof. For example, the read thresholds for the storage element 109 may be initialized upon programming a voltage at the storage element 109 and may be set "farther" as the programmed voltage is retained in the storage element 109 in order to accommodate variation in the programmed voltage (e.g., due to leakage current). Further, the read thresholds for the storage element 109 may be adjusted based on a number of program-erase cycles associated with the storage element 109 to accommodate variation in the programmed voltage due to program-erase operations.

The method 300 may include reading first data from the first subset using the first read threshold and reading second data from the second subset using the second read threshold, at 312. The first data may be decoded using a first log-likelihood ratio (LLR) associated with the first subset and the second data may be decoded using a second LLR associated with the second subset, at 314. The first LLR and the second LLR may be determined by the ECC engine 130 of FIG. 1. Using separate LLR values based on locations relative to the estimated location of the defect may enable the ECC engine 130 to be initialized based on a first CVD model associated with the first subset and a second CVD model associated with the second subset. Further, LLR values may be adaptive and may be determined based on one or more other parameters described herein (e.g., based on GMM parameters described with reference to FIG. 4).

One or more additional LLRs may be determined for storage elements near (e.g., within a threshold distance of) the estimated location of the defect. For example, because determining the exact location of the defect may be computationally complex (or because a particular location estimation technique may converge prior to determining the exact location), LLR values near the estimated location of the defect may be determined based on an average of the first LLR and the second LLR. According to a particular example, such averages are determined for a particular number of storage elements near the estimated location (e.g., for 10 storage elements to the left of the estimated location and for 10 storage elements to the right of the estimated location). The average LLR determined for a particular storage element may be weighted based on a distance between the estimated location and the particular storage element (e.g., with storage elements more to the left of the defect weighted less based on the right LLR and with storage elements less to the left of the defect, such as a storage element adjacent to the defect, weighted more based on the right LLR). A determination whether to utilize such additional LLRs may be determined based on a location error associated with the estimated location of the defect. For example, additional LLRs may be determined when the location error is large (e.g., is greater than a threshold), and additional LLRs may not be used when the location error is small (e.g., is less than or equal to the threshold). Location errors are described further with reference to Appendix 1, below.

In a particular illustrative embodiment, LLRs are determined for each storage element j of the plurality of storage elements based on a probability p[j] that the storage element is to the left of the estimated location of the defect. The LLRs may be determined using CVDs for first and second subsets of the plurality of storage elements (described below as left and right subsets for convenience), such as according to:

$$CVD[j]=p[j]*CVD_{left}+(1-p[j])*CVD_{right}.$$

CVD[j] indicates a value of the jth storage element in an "average" CVD, and $CVD_{left}$ and $CVD_{right}$ indicate the estimated CVDs for subsets to the left of the estimated location and to the right of the estimated location, respectively. The probability p[j] for storage elements far to the left of the estimated location will be approximately equal to one, and CVD[j] for such storage elements will be approximately equal to $CVD_{left}$. The probability p[j] for storage elements far to the right of the estimated location will be approximately equal to zero, and thus CVD[j] for such storage elements will be approximately equal to $CVD_{right}$. For storage elements near the estimated location, CVD[j] will be approximately equal to the average of $CVD_{left}$ and $CVD_{right}$ since the probability p[j] will be approximately equal to 0.5 (depending on the particular location error).

The probability p[j] for each storage element may be determined empirically (e.g., based on the accuracy of the technique used to determine the estimated location, such as the location error associated with the technique). Alternatively or in addition, the probability p[j] for each storage element may be determined using a modeling technique. For example, the probability p[j] may be determined according to:

$$p[j]=\frac{1}{2}(1+\tan h((j-b)c)).$$

The parameter j indicates the index value of a storage element, the parameter b indicates the estimated location of the defect (relative to indexed storage elements), and the parameter c indicates a constant value associated with a size of a region of uncertainty. The parameter c may be a constant that corresponds to the location error described below in connection with Appendix 1.

Alternatively or in addition, an LLR for each storage element j may be determined based on LLRs for the left and right subsets. For example, an LLR for each storage element j may be determined according to:

$$LLR[j]=p[j]*LLR_{left}[j]+(1-p[j])*LLR_{right}[j].$$

The parameters $LLR_{left}$ and $LLR_{right}$ indicate LLRs for the left and right subsets based on $CVD_{left}$ and $CVD_{right}$, respectively. Alternatively or in addition, a "low-complexity" technique may be used to determine LLRs for each storage element j. The low-complexity technique may correspond to:

$$LLR[j]=\min(|LLR_{left}[j]|,|LLR_{right}[j]|)*s.$$

The function min(|a|,|b|) returns a lesser value of the absolute value of a and the absolute value of b. The parameter s may indicate the sign (i.e., +1 or -1) of $LLR_{left}$ or $LLR_{right}$ depending on the relative magnitudes of $LLR_{left}$ and $LLR_{right}$. For example, s may correspond to the sign of $LLR_{left}$ if the magnitude of $LLR_{left}$ is greater than the magnitude of $LLR_{right}$. As another example, s may correspond to the sign of $LLR_{right}$ if the magnitude of $LLR_{right}$ is greater than the magnitude of $LLR_{left}$. The low-complexity technique may be applied for x−d≤j≤x+d, where x indicates a value corresponding to the estimated location of the defect. In some implementations, d may be constant. In other implementations, d may have a value that is based on a number of iterations of the particular technique used to determine the estimated location of the defect.

Because the first read threshold and the second read threshold are determined based on the estimated location of the defect, the method 300 of FIG. 3 may enable a controller to read data with a reduced bit error rate. Further, the method 300 may be performed "at the factory" (e.g., during a device under test (DUT) procedure), during operation of the data storage device (e.g., during user operation), or a combination thereof. Therefore, the method 300 may be performed to handle process variations that occur during manufacturing of the data storage device, to handle physical breaks that occur during operation of the data storage device, to handle other defects, or a combination thereof.

The method 300 may terminate, at 316. The method 300 of FIG. 3 may include one or more additional operations described herein not shown in FIG. 3. For example, the method 300 may include one or more operations described with reference to FIGS. 4 and 5, as described further below.

Figure 4:
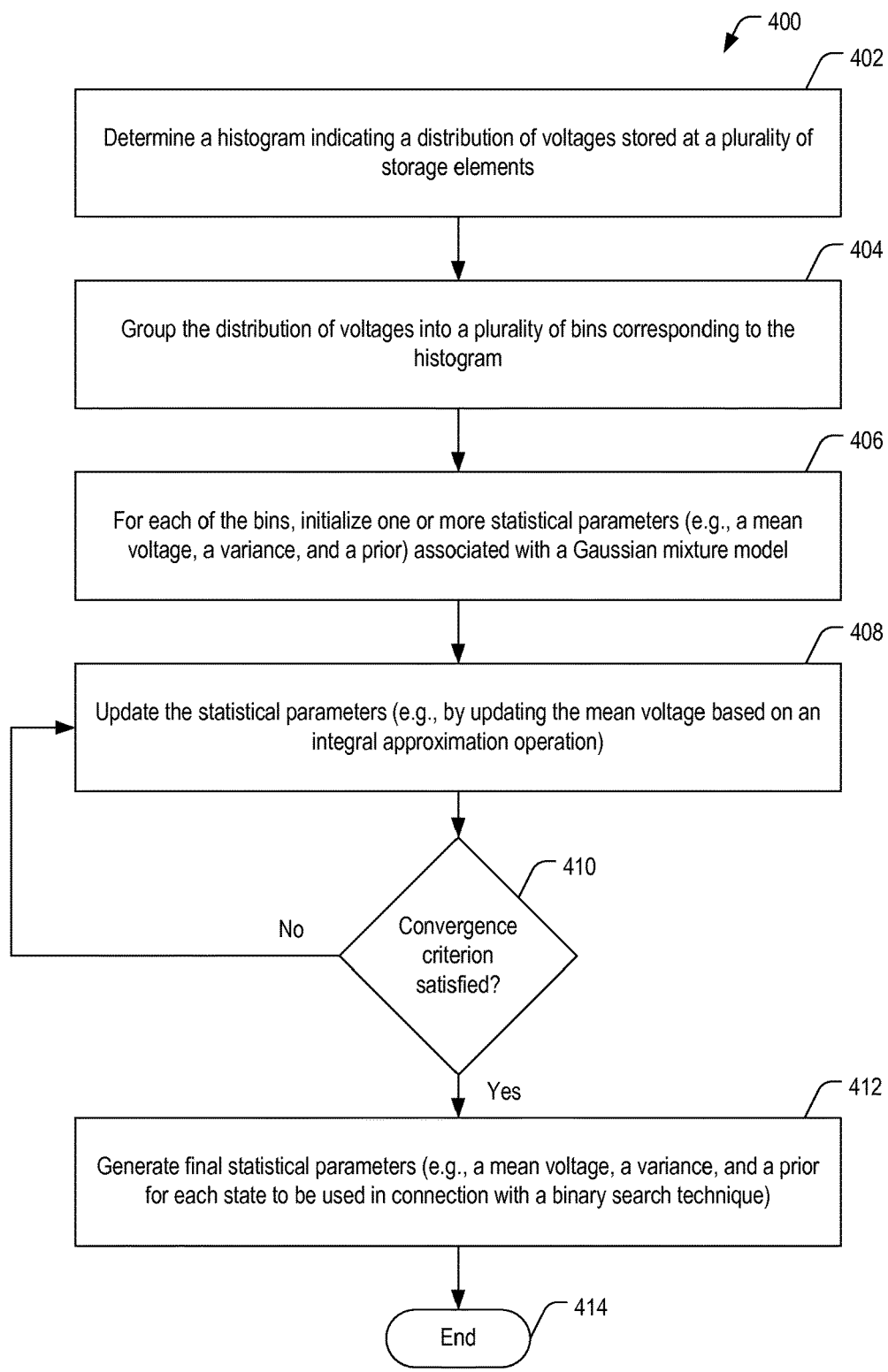
FIG. 4 is a flow chart of a particular illustrative embodiment of a method of determining an estimated location of a defect in a word line, such as the word line of the data storage device of FIG. 1.

Referring to FIG. 4, a particular illustrative embodiment of a method of determining an estimated location of a defect in a word line, such as the word line 120 of the data storage device 102 of FIG. 1, is depicted and generally designated 400. The method 400 may be performed at the data storage device 102 of FIG. 1, such as by the controller 126. For example, the method 400 may be performed by the defect location estimator 128 of FIG. 1. In a particular illustrative embodiment, the method 400 of FIG. 4 corresponds to an example of the Gaussian mixture model technique described with reference to 306 of FIG. 3.

At 402, a histogram may be determined. The histogram indicates a distribution of voltages stored at a plurality of storage elements. The histogram may correspond to the histogram 136 of FIG. 1. The plurality of storage elements may correspond to the plurality of storage elements 106 of FIGS. 1 and 2, the second plurality of storage elements 220 of FIG. 2, the nth plurality of storage elements 230 of FIG. 2, or a combination thereof.

At 404, the distribution of voltages of the histogram may be grouped into a plurality of "bins." For example, the distribution of voltages may be "divided" into 36 bins, where each voltage of the histogram is assigned to one of the bins. J may indicate a number of bins associated with the histogram. In a particular illustrative embodiment, J=36, although it should be appreciated that the value of J may be determined based on the particular application.

At 406, one or more statistical parameters may be initialized for each of the bins. The statistical parameters may be used in conjunction with a Gaussian mixture model (GMM) (e.g., a plurality of individual Gaussian distributions each corresponding to a particular logical bit value). As an example, for a three bit per cell configuration (assuming no word line defect), the GMM may correspond to a superposition of eight individual Gaussian distributions, since $2^3=8$. It will be appreciated that while a storage element may be programmed based on a particular voltage (e.g., 2 volts), the read voltage may be different (e.g., the read voltage may be 1.9 volts, 2.2 volts, etc.) due to physical constraints, defects, process variations, temperature variations, one or more other factors, or a combination thereof. Therefore, the GMM may approximate an actual distribution of voltages stored at the plurality of storage elements.

Further, when a word line defect exists, the GMM may include more individual Gaussian distributions than the number of programmable states. For example, in a particular three bit per cell configuration, a word line defect may cause the distribution of voltages to indicate 16 states (instead of 8 states). In such a case, the GMM may therefore include a superposition of 16 individual Gaussian distributions. The number of individual Gaussian distributions included in the GMM may be determined using a suitable technique, such as a "maxima" detecting technique that detects a number of "peaks" (e.g., critical points) included in the distribution of voltages. According to a particular example, the GMM is indicated by $f(v)$, where:

$$f(v) = \sum_{k=1}^{K} w[k]N(v \mid \mu[k], \sigma^2[k]).$$

The parameter N indicates an individual Gaussian probability density function. The parameter v[k] indicates the mean voltage for the kth bin. The parameter K indicates a number of possible logical states. For example, if the plurality of storage elements has a three bit per cell configuration, then K=8, since each storage element may be programmed to one of eight logical states. The parameter μ[k] indicates a mean voltage associated with the kth state.

The parameter $\sigma^2[k]$ indicates a variance associated with the kth state. The parameter w[k] indicates a weight (e.g., frequency of occurrence) associated with the kth state, such as a "prior" parameter. To illustrate, for a uniform occurrence of eight states, w[1]=w[2]=w[3]=w[4]=w[5]=w[6]=w[7]=w[8]=0.125. According to at least one example, the states k may occur approximately uniformly if data stored at the plurality of storage elements is scrambled, such as when the controller 126 includes a scrambler that interleaves data stored at the plurality of storage elements. According to other examples, the states k may occur non-uniformly.

The one or more statistical parameters may be initialized according to a suitable technique. According to at least one technique, the parameter v[j] is initialized according to T[j−1]<v[j]<T[j] for j=1, 2, . . . , J, where T[j] indicates a threshold voltage between the (j−1)th bin and the jth bin for j=1, 2, . . . , J−1. The "boundary" threshold voltages (i.e., T[0] and T[j]) may be selected as values that are practical for the particular application (though T[0] and T[j] may mathematically correspond to −∞ and +∞, respectively). The parameters w[k], μ[k], and w[k] may be initialized based on measured parameters, such as initial GMM parameters prior to being updated.

At 408, the statistical parameters may be updated. According to at least one example, the statistical parameters are updated based on an "expectation maximization" ("EM") technique that includes an expectation step (e-step) and a "maximization" step ("m-step"). The e-step may include determining:

$$f[k,j]=\text{normcdf}(T[j]|\mu[k],\sigma^2[k])-\text{normcdf}(T[j-1]|\mu[k],\sigma^2[k]).$$

The parameter normcdf indicates a normal cumulative distribution function. Updating the statistical parameters may further include updating a probability matrix R[k,j] according to:

$$R[k,j]=w[k]f[k,j].$$

The statistical parameters may be further updated based on the m-step, where the m-step includes updating a weight n for each of the K states based on the probability matrix R[k,j]. For example, each weight n may be updated according to:

$$n[k] = \sum_{j=1}^{J} R[k,j]h[j].$$

The parameter h[j] may indicate a probability mass function (PMF) for the jth bin of the histogram. A normalization factor N may be determined based on the weights. For example, the normalization factor N may be determined according to:

$$N = \sum_{k=1}^{K} n[k].$$

The statistical parameters may be updated based on the normalization factor N. For example, according to at least some embodiments, each prior w may be updated. According to other embodiments, updating each prior w may be omitted. For example, updating each prior w may be omitted when each state k of the K states occurs uniformly or substantially uniformly, such as when a scrambler of the controller 126 scrambles data and distributes data between each of the K states substantially uniformly. If the K states are not uniformly distributed, then each prior w may be updated to generate an updated prior $w_{new}$ for each state k. For example, each updated prior $w_{new}$ may be generated according to:

$$w_{new}[k] = \frac{n[k]}{N}.$$

The mean voltage for each state may be updated to generate an updated mean voltage $\mu_{new}$ for each state, such as according to:

$$\mu_{new}[k] = \frac{1}{n[k]} \sum_{j=1}^{J} R[k,j]h[j]v[j].$$

Each variance $\sigma^2$ may also be updated to generate an updated variance $\sigma^2_{new}$ for each state. For example, each variance $\sigma^2$ may be updated according to:

$$\sigma^2_{new}[k] = \sum_{j=1}^{J} R[k,j]h[j](v[j] - \mu_{new}[k])^2.$$

In at least one embodiment, the mean voltage v for each bin is adjusted (e.g., "fine-tuned") based on an integral approximation operation. For example, the mean voltage v may be updated for each bin based on an approximation (e.g., weighted sum approximation) of:

$$v[j] = \sum_{k=1}^{K} w[k] \int_{T[j-1]}^{T[j]} xN(x \mid \mu_{new}[k], \sigma^2_{new}[k]) dx.$$

At 410, a determination may be made whether a convergence criterion is satisfied. For example, if the updated variance $\sigma^2_{new}$ is similar to (e.g., within a threshold of) the previous variance estimate (i.e., $\sigma^2$), then a determination may be made that the convergence criterion is satisfied. According to a particular illustrative embodiment, the convergence criterion is indicated as e and is determined according to:

$$e = \frac{\sum_{k=1}^{K} |\sigma^2_{new}[k] - \sigma^2[k]|^2}{\sum_{k=1}^{K} |\sigma^2[k]|^2}.$$

Determining whether the convergence criterion is satisfied may include determining whether e satisfies a threshold number. If the convergence criterion is not satisfied (e.g., if e is greater than the threshold number), then the statistical parameters are re-updated. If the convergence criterion is satisfied (e.g., if e is less than or equal to the threshold number), then final statistical parameters may be generated, at 412. The final statistical parameters may include the statistical parameters updated at 408, such as the updated prior $w_{new}$ for each state, the updated mean voltage $\mu_{new}$ for each state, and the updated variance $\sigma^2_{new}$ for each state. The final statistical parameters may be used in connection with a binary search technique to determine an estimated defect location, such as in connection with a binary search technique. Particular examples of using the final statistical parameters in connection with binary search techniques are described further with reference to FIG. 5.

After generating the final statistical parameters, the method 400 may terminate, at 414. In a particular embodiment, after determining the estimated location of the defect, operation continues to 308 of the method 300 of FIG. 3. For example, the estimated location of the defect determined using the method 400 of FIG. 4 may be utilized while performing the method 300 of FIG. 3. The final statistical parameters generated at 412 of FIG. 4 may be utilized in connection with one or more techniques described with reference to FIG. 5, as described further below.

Because the method 400 includes updating each mean voltage v based on an integral approximation operation, the bins of the GMM may reflect an actual underlying distribution of voltages stored at the plurality of storage elements. To illustrate, if a bin of the histogram corresponds to a range of one volt to two volts, the underlying distribution of voltages may be centered somewhere other than 1.5 volts—for example, the underlying distribution may correspond to a Gaussian distribution that is centered at 1.8 volts. Accordingly, by "fine-tuning" the histogram based on an actual distribution of voltages, accuracy of determining estimated locations of word line defects may be improved (as compared to assuming that a center of each bin, such as 1.5 volts, is a representative value). In addition, the convergence criterion may be determined based on the particular application. For example, the convergence criterion may correspond to a lower threshold number when high error correction performance is desired, and the convergence criterion may correspond to a higher threshold number when fast error correction performance is desired.

Figure 5:
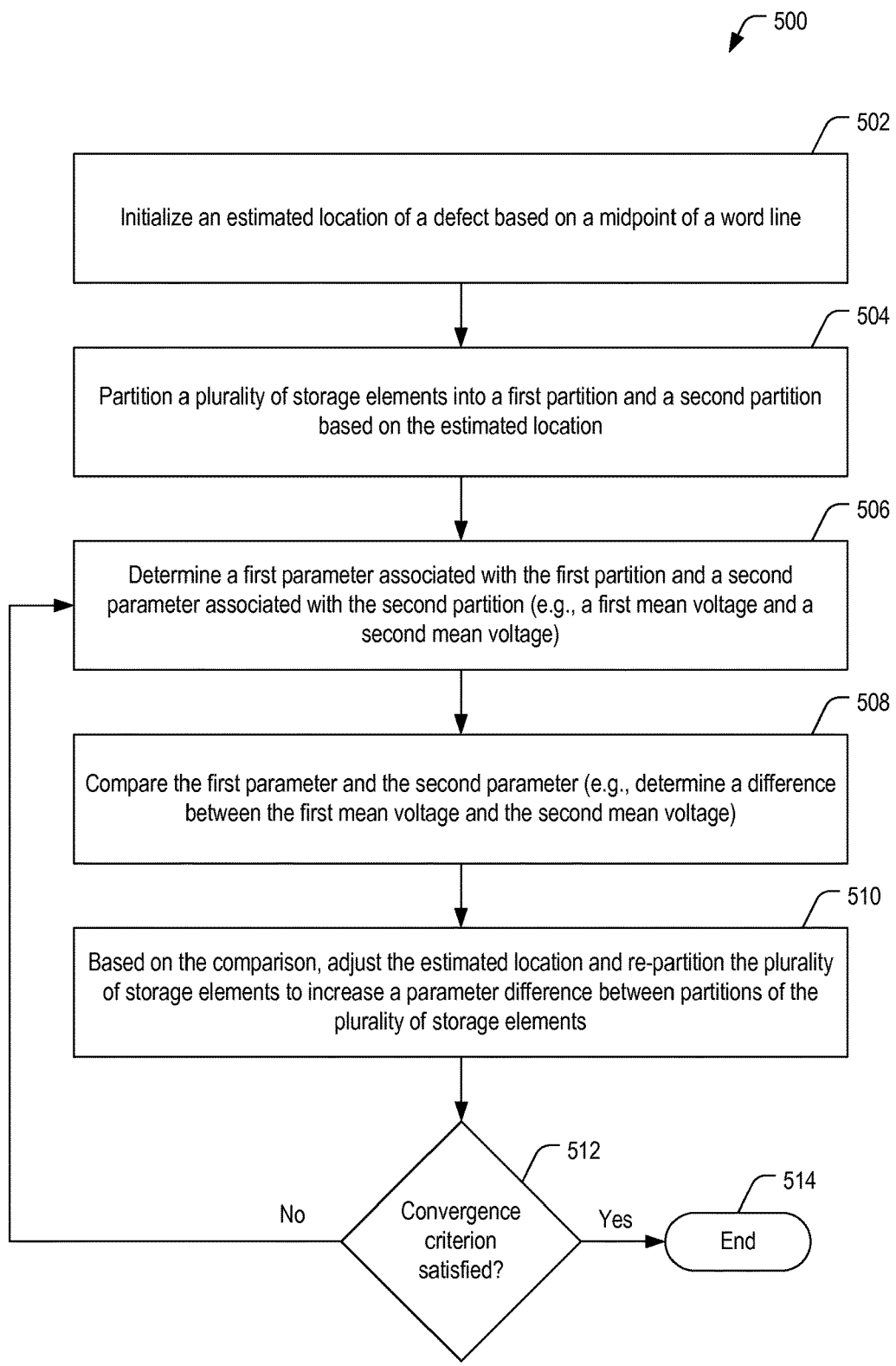
FIG. 5 is a flow chart of a particular illustrative embodiment of another method of determining an estimated location of a defect in a word line, such as the word line of the data storage device of FIG. 1.

Referring to FIG. 5, a particular illustrative embodiment of a method of determining an estimated location of a defect in a word line, such as the word line 120 of the data storage device 102 of FIG. 1, is depicted and generally designated 500. The method 500 may be performed at the data storage device 102 of FIG. 1, such as by the controller 126. For example, the method 500 may be performed by the defect location estimator 128 of FIG. 1. In a particular illustrative embodiment, the method 500 corresponds to the binary search technique described with reference to step 306 of FIG. 3.

The method 500 may include initializing an estimated location of a defect based on a midpoint of a word line, at 502. The defect may correspond to the defect 122 of FIGS. 1 and 2, the second defect 240 of FIG. 2, the third defect of 242 of FIG. 2, or a combination thereof. The word line may correspond to the word line 120 of FIGS. 1 and 2, the second word line 226 of FIG. 2, or the nth word line 238 of FIG. 2.

At 504, a plurality of storage elements may be partitioned into a first partition and a second partition based on the estimated location of the defect. The first partition may correspond to any of the subsets 108, 118 of FIGS. 1 and 2, the subsets 222, 224, 232, 234, 236 of FIG. 2, or a combination thereof. The second partition may correspond to another of the subsets 108, 118, of FIG. 1, the subsets 222, 224, 232, 234, 236 of FIG. 2, or a combination thereof.

At 506, a first parameter and a second parameter may be determined. The first parameter is associated with the first partition. The second parameter is associated with the second partition. The first parameter may correspond to a first mean voltage of storage elements of the first partition. The second parameter may correspond to a second mean voltage of storage elements of the second partition. The first parameter and the second parameter may correspond to any of the final statistical parameters described with reference to FIG. 4. For example, in a particular illustrative embodiment, the first mean voltage corresponds to first mean voltages μ for the first partition determined according to the GMM technique described with reference to FIG. 4 and the second mean voltage corresponds to second mean voltages μ for the second partition determined according to the GMM technique described with reference to FIG. 4. The first mean voltage and the second mean voltage may be determined based on the EM technique described with reference to FIG. 4. According to other embodiments, the first parameter and the second parameter may correspond to other statistical parameters for the first partition and the second partition, such as the prior w described with reference to FIG. 4 and/or the variance $\sigma^2$ described with reference to FIG. 4. To further illustrate, a particular illustrative example of pseudo-code corresponding to the method 500 of FIG. 5 and utilizing the EM technique of FIG. 4 is provided below in Appendix 1.

At 508, the first parameter and the second parameter may be compared. Comparing the first parameter and the second parameter may include determining a difference between the first mean voltage and the second mean voltage. The difference may correspond to a distance between a first vector associated with the first mean voltage and a second vector associated with the second mean voltage, as described further with reference to Appendix 1.

At 510, based on the comparison, the estimated location of the defect may be adjusted (e.g., to the left or to the right), and the plurality of storage elements may be repartitioned to increase a parameter difference between partitions of the plurality of storage elements. At 512, a determination is made whether a convergence criterion is satisfied. If the convergence criterion is not satisfied, then the plurality of storage elements may be repartitioned. Determining whether the convergence criterion is satisfied may include determining whether the difference between the first vector and the second vector is greater than or equal to a difference between mean voltages associated with partitions about a first (e.g., "right") candidate and may further include determining whether the difference between the first vector and the second vector is greater than or equal to a difference between mean voltages associated with partitions about a second (e.g., "left") candidate, as described further with reference to Appendix 1. Alternatively or in addition, the convergence criterion may correspond to a number of iterations to be performed (e.g., a value of imax in Appendix 1).

If the convergence criterion is satisfied, then the estimated location of the defect has been determined and the method 500 may terminate, at 514. In a particular embodiment, if the convergence criterion is satisfied, operation continues at 308 of FIG. 3. For example, the estimated location of the defect determined using the method 500 of FIG. 5 may be utilized while performing the method 300 of FIG. 3.

Appendix 1 depicts a particular illustrative example of pseudo-code corresponding to the method 500 of FIG. 5. It should be understood that the example of Appendix 1 is demonstrative and that instructions utilized in a particular application may depend on the nature of the application. For example, a number of iterations used (e.g., a value of "imax" in Appendix 1) may depend on the particular application. To illustrate, if a location error associated with the pseudo-code of Appendix 1 is less than $1/(2^{(imax-1)})$, then the value of imax may be selected based on an error tolerance associated with the particular application.

In Appendix 1, a location of a defect (a "break point") is estimated by initializing an estimated location (a "candidate") as a midpoint of a word line and by iteratively moving the candidate left or right to re-partition the plurality of storage elements. The location of the defect may be selected as the candidate that increases (e.g., "maximizes") a difference between a mean voltage of one subset of storage elements as compared to another subset of the storage elements (e.g., storage elements to the left of the candidate location as compared to storage elements to the right of the candidate location). As shown in Appendix 1, the mean voltages may be determined using the EM technique described with reference to FIG. 4. The candidates may be determined using the CVD tracking technique described with reference to FIG. 3.

APPENDIX 1

```
% read voltage excluding the erase state
% initialization (set default normal state voltage)
mu_init = [115 231 409];
% initial calculation by using the center cell location
cell_mid = round(num_cells / 2);
% partitioning the cells around the break point (right and left) and
% obtain histogram of each partition
cvd_right = cvd_part(cell_mid, right);
cvd_left = cvd_part(cell_mid, left);
% run EM algorithm to get mean estimate
mu_r = EM(cvd_right, mu_init);
mu_l = EM(cvd_left, mu_init);
% calculate the distance of the two mean vectors
dmu_mid = distance(mu_r, mu_l);
% the binary search loop
cell_right_limit = max_voltage;
cell_left_limit = 1;
imax = 10; % a predefined parameter
for i = 1:imax
        % two new break point candidates
        cell_right = round((cell_mid + cell_right_limit) / 2);
        cell_left = round((cell_mid + cell_left_limit) / 2);
        % right break point candidate
        cvd_right = cvd_part(cell_right, right);
        cvd_left = cvd_part(cell_right, left);
        mu_r = EM(cvd_right, mu_init);
        mu_l = EM(cvd_left, mu_init);
        dmu_right = distance(mu_r, mu_l);
        % left break point candidate
        cvd_right = cvd_part(cell_left, right);
        cvd_left = cvd_part(cell_left, left);
        mu_r = EM(cvd_right, mu_init);
        mu_l = EM(cvd_left, mu_init);
        dmu_left = distance(mu_r, mu_l);
        % comparison
        % optional termination
        % if (dmu_mid >= dmu_right && dmu_mid >= dmu_left)
        % break;
        % end
        if (dmu_right > dmu_left)
                cell_left_limit = cell_mid;
                cell_mid = cell_right;
                dmu_mid = dmu_right;
        else
                cell_right_limit = cell_mid;
                cell_mid = cell_left;
                dmu_mid = dmu_left;
        end
end
break_point = cell_location(cell_mid);
```

By using techniques described with reference to the method 500 of FIG. 5 and the illustrative pseudo-code of Appendix 1, an estimated location of a defect of a word line can be determined efficiently, thus enabling improved performance of a data storage device. For example, the techniques described in connection with the method 500 of FIG. 5 and the illustrative pseudo-code of Appendix 1 enable selection of an estimated location of a defect (e.g., a "break point" as described in Appendix 1) by determining a candidate location that increases (e.g., "maximizes") a difference between a mean voltage of one subset of storage elements as compared to another subset of the storage elements (e.g., storage elements to the left of the candidate location as compared to storage elements to the right of the candidate location). Accordingly, the techniques described with reference to FIG. 5 and Appendix 1 may enable determination of estimated locations of word line defects, which may improve performance of a data storage device (e.g., by reducing a bit error rate associated with data stored at the data storage device).

In accordance with the above embodiments, a number of alternative configurations and techniques are described. Those of skill in the art will appreciate that appropriate configurations and techniques may be selected based on the particular application. For example, a "two-step" technique may be used to determine both whether a defect exists and to estimate a location of any such defect. The two-step technique may include performing the EM operations described with reference to FIG. 4 for the first subset and for the second subset to determine statistical parameters (e.g., means, variances, and/or priors). If a difference between the statistical parameters for the first subset (e.g., $w_{left}$, $\mu_{left}$ and $\sigma_{left}$) and the statistical parameters for the second subset (e.g., $w_{right}$, $\mu_{right}$, and $\sigma_{right}$) fails to satisfy a threshold, then a determination is made (e.g., by the condition detector 132 of FIG. 1) that no defect exists. If the difference satisfies the threshold, then a determination may be made (e.g., by the defect location estimator 128 of FIG. 1) that the subset having the greater variance contains a defect. The two-step technique may utilize the following equation:

$$CVD = N_{left} * GMM(w_{left}, \mu_{left}, \sigma_{left}) N_{right} * GMM(w_{right}, \mu_{right}, \sigma_{right}).$$

The parameters $N_{left}$ and $N_{right}$ indicate the number of storage elements included in the left and right subsets, respectively. The sum of the left priors $w_{left}$ and the sum of the right priors $w_{right}$ are each equal to one, such that $sum(w_{left}) = sum(w_{right}) = 1$. Because the statistical parameters for the subset that does not include the defect may be assumed to be accurate, certain computations may be omitted (e.g., by assuming that the statistical parameters for the "good" side of the word line are accurate). Thus, the two-step technique may enable fewer operations (e.g., fewer CVD read operations and fewer EM operations) as compared to the binary search technique described with reference to FIG. 5.

According to a "maximum mean difference" ("MMD") technique, a "maximum" point is determined based on a function $f(x) = El(x) - Er(x)$, where $El(x)$ indicates an average voltage of storage elements to the left of a storage element x and $Er(x)$ indicates an average voltage of storage elements to the right of the storage element x. After determining values of $f(x)$ for each storage element x, the storage element x corresponding to a highest determined value of $f(x)$ may be selected as the maximum point. In at least one embodiment, if $f(x)$ does not have a clear maximum point, then a determination is made (e.g., by the condition detector 132 of FIG. 1) that no defect exists in the word line.

If a maximum point is detected, then a determination may be made (e.g., by the defect location estimator 128 of FIG. 1) that the defect is located near the storage element x corresponding to the maximum point. The MMD technique may enable efficient defect location estimation (e.g., estimation using computationally simple calculations, which may avoid EM calculations) and may be particularly applicable in certain applications where accuracy of the estimation is of less importance than computational simplicity. For example, a computational complexity of the MDD technique may be of the order of approximately 2N operations, where N indicates a number of storage elements of a word line. In a particular embodiment, if the MMD technique does not yield a clear maximum point, then another technique (e.g., a GMM technique, a binary search technique, another technique, or a combination thereof) may be used. In a particular embodiment, instead of determining a mean voltage for left and right subsets for each storage element x, a mean of a highest voltage state or threshold (e.g., as determined during a CVD tracking operation) may be utilized in connection with the MDD technique. In at least some applications, using such a highest voltage state or threshold may yield a higher sensitivity to defects as compared to determining mean voltages for all voltage states or thresholds.

According to a "moving average" technique, data stored at a plurality of storage elements coupled to a word line is read using a high resolution read technique. By reading the data using the high resolution read technique, voltage thresholds for each of the storage elements are determined. The moving average technique may further include determining a moving average voltage using a moving average (e.g., a "sliding window"). A particular storage element is identified for which the moving average voltage changes. Because the moving average voltage changes near the particular storage element, a defect in the word line may exist near the particular storage element.

In response to identifying the particular storage element, left and right CVDs (and corresponding read thresholds) are determined for left and right subsets of storage elements relative to the particular storage element. The moving average technique may further include using the thresholds to identify read bits for each storage element as a function of a read voltage of the storage element and a position of the storage element relative to the estimated location of the defect. LLRs may be determined for each bit as a function of the read voltage. Data may be decoded using the particular LLR and ECC code corresponding to the particular bits being decoded.

According to a "side information" technique, first data may be read from a plurality of storage elements coupled to a word line. If a condition associated with a defect in the word line is detected (e.g., by the condition detector 132 of FIG. 1), the first data may be temporarily moved (e.g., to the RAM 134 of FIG. 1). The plurality of storage elements may be re-written with second data that includes a predefined pattern (e.g., a repeating pattern of an erase state, a first logical state, a second logical state, and a third logical state). After writing the second data, the second data is read from the plurality of storage elements and a state transition probability model is determined based on a difference between the read second data and the second data as written (i.e., the predefined pattern). Based on the state transition probability model, the first data is processed (e.g., decoded, corrected, etc.). The state transition probability model may be stored (e.g., at the non-volatile memory 104 of FIG. 1) and used each time data is read from the plurality of storage elements.

According to another technique, a word line defect is detected (e.g., by the condition detector 132 of FIG. 1) by determining whether a number of individual Gaussian distributions included in a GMM model exceeds a threshold. As described above with reference to FIG. 4, the number of individual Gaussian distributions included in a GMM may be determined using a "maxima" detecting technique that detects a number of "peaks" (e.g., critical points) included in a distribution of voltages. If the number of peaks satisfies a threshold (e.g., exceeds a threshold number, such as twice the number of programmable states), then a determination is made that a condition associated with a word line defect has been detected.

Although certain operations are described herein with reference to the controller 126 of FIG. 1 (and components thereof), it should be appreciated that various components and functionalities can be implemented in devices outside of the data storage device 102 of FIG. 1. For example, those of skill in the art will appreciate that certain structures and operations described with reference to the defect location estimator 128 of FIG. 1 and the condition detector 132 of FIG. 1 may be implemented in a computer, such as a laboratory computer to test and/or verify operation of the data storage device 102. Alternatively or in addition, such structures and operations may implemented in the controller 126 during such testing and verification of the data storage device 102, during operation of the data storage device 102 (e.g., during user operation), or a combination thereof.

It should be further appreciated that although certain structures and techniques have been described herein with reference to word line defects, one or more structures and techniques may be applicable structures other than word lines depending on the particular application. For example, depending on the particular application, one or more structures and techniques described herein may be applicable to bit line defects, storage element defects (e.g., a defect in a floating gate structure or in another structure of a transistor), one or more other defects, or a combination thereof.

It should be further appreciated that although certain mathematical terminology (e.g., "maximum") is used herein to facilitate ease of understanding for those of skill in the art, various techniques may be influenced (e.g., constrained) by practical considerations. For example, due to constraints associated with precision of measurements and/or calculations, a determined "maximum" value may or may not correspond to the highest possible value, as will be recognized by those of skill in the art.

Further, terms such as "left" and "right" are intended for convenience of description and need not denote exact physical locations. For example, because data of columns of storage elements and data of storage elements within each column may be interleaved according to one or more interleaving techniques, an order of data read from a particular set of storage elements may not correspond to an order of data written to the set of storage elements. Accordingly, certain data may be re-ordered, though not explicitly described above. Such re-ordering may occur "on-the-fly" (OTF) (e.g., while reading the data) or subsequent to reading the data (e.g., during determination of an estimated location of a defect). In addition, due to such interleaving, a particular ECC codeword (e.g., "E-block") may include data from storage elements on both sides of a defect (e.g., data from both of the subsets 108, 118 of FIG. 1). Accordingly, decoding an ECC codeword by the ECC engine 130 of FIG. 1 may include using LLR values for both of the subsets 108, 118.

Although various components depicted herein are illustrated as block components and described in general terms, such components may include one or more microprocessors, state machines, or other circuits configured to enable the controller 126 of FIG. 1 to detect and handle word line defects. For example, the defect location estimator 128, the ECC engine 130, and the condition detector 132 of FIG. 1 may correspond to physical components, such as hardware controllers, state machines, logic circuits, one or more other structures, or a combination thereof, to enable the controller 126 of FIG. 1 to detect and handle word line defects.

The defect location estimator 128, the ECC engine 130, and the condition detector 132 of FIG. 1 may be implemented using a microprocessor or microcontroller programmed to perform operations described herein, such as operations described with reference to the methods 300, 400, 500 of FIGS. 3-5. In a particular embodiment, the controller 126 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices, such as the host device 150. However, in other embodiments, the data storage device 102 may be attached to or embedded within one or more host devices, such as within a housing of a host communication device, which may correspond to the host device 150. For example, the data storage device 102 may be integrated within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, multi-level cell (MLC)), a divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a non-volatile memory and a controller, wherein the non-volatile memory includes a word line coupled to a plurality of storage elements, performing by the controller:
   detecting a condition associated with a defect in the word line;
   determining an estimated location of the defect by:

initializing a location estimate of the defect based on a midpoint of the word line;

partitioning the plurality of storage elements into a first partition and a second partition about the midpoint; and based on a comparison of a first parameter associated with the first partition and a second parameter associated with the second partition, adjusting the location estimate to increase a parameter difference between partitions of the plurality of storage elements;

determining a first subset of the plurality of storage elements and a second subset of the plurality of storage elements based on the estimated location of the defect; and determining a first read threshold for the first subset and a second read threshold for the second subset, wherein reading data from the word line using at least one of the first read threshold or the second read threshold reduces an error rate associated with the data as compared to not using the at least one of the first read threshold or the second read threshold.

2. The method of claim 1, wherein reading the data from the second subset using the second read threshold results in fewer errors than reading the data from the second subset using the first read threshold.

3. The method of claim 1, wherein the defect corresponds to a physical break in the word line.

4. The method of claim 1, wherein the defect corresponds to a process variation of a width of the word line.

5. The method of claim 1, further comprising reading first data from the first subset using the first read threshold and reading second data from the second subset using the second read threshold.

6. The method of claim 5, further comprising decoding the first data using a first log-likelihood ratio (LLR) associated with the first subset and decoding the second data using a second LLR associated with the second subset.

7. The method of claim 1, further comprising determining a Gaussian mixture model (GMM) associated with a voltage distribution at the plurality of storage elements, wherein determining the GMM includes determining a mean voltage associated with the GMM based on an integral approximation operation.

8. The method of claim 1, wherein determining the estimated location of the defect is performed according to a binary search technique.

9. The method of claim 1, wherein determining the first read threshold and the second read threshold are performed according to a cell voltage distribution (CVD) tracking technique.

10. The method of claim 1, wherein determining the first read threshold and the second read threshold are performed according to a dynamic read technique.

11. The method of claim 1, wherein the data storage device is embedded within a host device.

12. A data storage device comprising a controller coupled to a non-volatile memory that includes a plurality of storage elements and a word line, wherein:

the controller is configured to:

detect a condition associated with a defect in the word line;

determine an estimated location of the defect;

determine a first subset of the plurality of storage elements and a second subset of the plurality of storage elements based on the estimated location of the defect; and determine a first read threshold for the first subset and a second read threshold for the second subset to reduce an error rate associated with reading data from the word line using at least one of the first read threshold or the second read threshold as compared to not using the at least one of the first read threshold or the second read threshold, and to determine the estimated location of the defect, the controller is further configured to:

initialize a location estimate of the defect based on a midpoint of the word line;

partition the plurality of storage elements into a first partition and a second partition about the midpoint; and adjust, based on a comparison of a first parameter associated with the first partition and a second parameter associated with the second partition, the location estimate to increase a parameter difference between partitions of the plurality of storage elements.

13. The data storage device of claim 12, wherein the data storage device is embedded within a host device.

14. The data storage device of claim 12, wherein the controller is further configured to detect the condition by reading, using a common read threshold, first data from the first subset and second data from the second subset and by determining that the second data contains a number of errors that exceeds a threshold.

15. The data storage device of claim 12, wherein the controller is further configured to detect the condition by determining a histogram of voltages at the plurality of storage elements, the histogram indicating that a voltage difference between adjacent storage elements of the plurality of storage elements exceeds a threshold.

16. The data storage device of claim 12, wherein the controller includes:

a condition detector configured to detect the condition; and a defect location estimator configured to determine the estimated location of the defect.

17. A data storage device comprising a controller coupled to a non-volatile memory including a plurality of storage elements, wherein:

the controller is configured to:

detect a condition associated with a defect in a structure of the non-volatile memory;

determine an estimated location of the defect based on a binary search of parameters associated with storage elements coupled to a word line;

determine a first subset of the plurality of storage elements and a second subset of the plurality of storage elements based on the estimated location of the defect; and determine a first read threshold for the first subset and a second read threshold for the second subset, wherein, by using voltage thresholds that are determined based on the estimated location of the defect, bit error rates of read data are reduced, and to determine the estimated location of the defect based on the binary search, the controller is further configured to:

initialize a location estimate of the defect based on a midpoint of the word line;

partition the plurality of storage elements into a first partition and a second partition about the midpoint; and adjust, based on a comparison of a first parameter associated with the first partition and a second parameter associated with the second partition, the location estimate to increase a parameter difference between partitions of the plurality of storage elements.

18. The data storage device of claim 17, wherein the controller is further configured to read first data from the first subset using the first read threshold and to read second data from the second subset using the second read threshold.

19. The data storage device of claim 18, wherein the controller includes an error correcting code (ECC) engine configured to decode the first data using a first log-likelihood ratio (LLR) associated with the first subset and further configured to decode the second data using a second LLR associated with the second subset.

20. An apparatus comprising means for storing information and means for performing operations, the means for storing information including means for storing data and a word line, wherein:
the means for performing operations is configured to:
   detect a condition associated with a defect in the word line;
   determine an estimated location of the defect;
   determine a first subset of the means for storing data and a second subset of the means for storing data based on the estimated location of the defect; and
   determine a first read threshold for the first subset and a second read threshold for the second subset, wherein, by using voltage thresholds that are determined based on the estimated location of the defect, bit error rates of read data are reduced as compared to applying a common set of read thresholds for storage elements accessed via the word line, and
the means for performing operations, to determine the estimated location of the defect, is further configured to:
   initialize a location estimate of the defect based on a midpoint of the word line;
   partition the means for storing data into a first partition and a second partition about the midpoint; and
   adjust, based on a comparison of a first parameter associated with the first partition and a second parameter associated with the second partition, the location estimate to increase a parameter difference between partitions of the means for storing data.

21. The apparatus of claim 20, wherein the means for performing operations is further configured to detect the condition by reading, using a common read threshold, first data from the first subset and second data from the second subset and by determining that the second data contains a number of errors that exceeds a threshold.

* * * * *